(12) United States Patent
Chiba

(10) Patent No.: US 6,773,503 B2
(45) Date of Patent: Aug. 10, 2004

(54) METHOD OF HEAT-TREATING FLUORIDE CRYSTAL, METHOD OF PRODUCING OPTICAL PART, AND OPTICAL APPARATUS

(75) Inventor: Takao Chiba, Ryugasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/534,019

(22) Filed: Mar. 24, 2000

(65) Prior Publication Data
US 2002/0117105 A1 Aug. 29, 2002

(30) Foreign Application Priority Data
Mar. 30, 1999 (JP) ............................................ 11-088096

(51) Int. Cl.[7] .................................................. C30B 1/10
(52) U.S. Cl. ........................ 117/3; 117/4; 117/6; 117/7; 117/940
(58) Field of Search ............................... 117/3, 4, 6, 7, 117/940

(56) References Cited

U.S. PATENT DOCUMENTS

| | | | | |
|---|---|---|---|---|
| 4,171,400 A | * | 10/1979 | Rosette et al. | 428/357 |
| 4,684,222 A | * | 8/1987 | Borrelli et al. | 350/420 |
| 4,767,725 A | * | 8/1988 | Mizutani et al. | 501/3 |
| 5,846,638 A | * | 12/1998 | Meissner | 428/220 |
| 6,146,456 A | * | 11/2000 | Mizugaki et al. | 117/2 |

* cited by examiner

Primary Examiner—Robert Kunemund
(74) Attorney, Agent, or Firm—Fitzpatrick, Cella, Harper & Scinto

(57) ABSTRACT

The method of heat-treating a fluoride crystal according to the present invention comprises introducing an inert gas and/or a fluorine-based gas into a heat-treating furnace in which a fluoride crystal is placed through a gas-feeding port, and heating the fluoride crystal in the atmosphere of the gas having a pressure not lower than atmospheric pressure, thereby making it possible to prevent turbidity and coloration generated in the fluoride crystal due to oxygen and metal impurities adsorbed by the surface of the fluoride crystal.

13 Claims, 4 Drawing Sheets

METHOD OF HEAT-TREATING FLUORIDE CRYSTAL, METHOD OF PRODUCING OPTICAL PART, AND OPTICAL APPARATUS

BACKGROUND OF THE INVENTION

1. Field of the Invention

This invention relates to a method of heat-treating a fluoride crystal, a method of producing an optical part, and an optical apparatus, and more particularly to a method of heat-treating (annealing) a fluoride crystal such as calcium fluoride, barium fluoride and strontium fluoride.

2. Related Background Art

The use of ultraviolet light has been increased in the field of laser processing, for example, in photolithography which is used in the production of semiconductor devices such as a microprocessor, a memory, a system LSI, an image sensor, a light-emitting element and a display element.

With such an increase, a material other than quartz glass has been demanded for use in optical parts such as lens, a prism, a half mirror and a window material.

Fluoride crystals such as calcium fluoride, barium fluoride, strontium fluoride and lithium fluoride are preferably used for optical parts as a highly light-transmissive material.

In the production process of a fluoride crystal, annealing is conducted by heating the fluoride crystal almost to a temperature of the melting point of the fluoride crystal without melting the fluoride crystal so that a stress generated in the inside of the crystal can be relaxed.

The double refractions of the fluoride crystal before and after the annealing are measured and it is found that double refraction is significantly decreased in the fluoride crystals subjected to the annealing.

However, in order to enhance the annealing effect, for example, in the case of calcium fluoride, the fluoride crystal is subjected to the annealing of increasing a heating temperature up to 1000° C. or more, whereby turbidity and coloration sometimes occurred.

After the investigation of the cause, it was found that the occurrence of such turbidity and coloration was due to oxygen adsorbed by and metal impurities attached to the surface of the fluoride crystal. Fluoride crystals taken out from a crystal-growing furnace after crystal growth are carried in the atmosphere so as to be placed in a heat-treating furnace, and oxygen and impurities may attach to the crystals during this carrying step.

When such oxygen and impurities are heated to a temperature of 1000° C. or higher, they diffuse in and react with the calcium fluoride. This may cause turbidity and coloration. Such a phenomenon also occurs in the other fluoride crystals whose melting points are different from that of calcium fluoride.

SUMMARY OF THE INVENTION

Accordingly, an object of the present invention is to provide a method of heat-treating a fluoride crystal and a method of producing an optical part without easily generating turbidity and coloration in the crystal and the part.

Another object of the present invention is to provide an optical apparatus excellent in optical properties, which is produced by using the optical part obtained by the above heat-treating and production methods.

A further object of the present invention is to provide a method of heat-treating a fluoride crystal which comprises the steps of making an atmosphere of an inert gas and/or fluorine-based gas having a pressure not lower than atmospheric pressure in a heat-treating furnace in which a fluoride crystal is placed, and heating the fluoride crystal in the above atmosphere.

DESCRIPTION OF THE PREFERRED EMBODIMENTS

The preferred embodiments of the present invention will be described below.

(Preparation Step)

First, a step of preparing a fluoride crystal to be annealed will be described.

A powdered or granular raw material of a chemically synthesized fluoride is put in a refining crucible, and if necessary, a scavenger such as zinc fluoride is mixed with the material so as to remove oxygen.

The refining crucible is heated to melt the fluoride raw material and then cooled to form a mass of a refined fluoride.

Then the mass is crushed into pieces of an appropriate size and put in a crystal growing crucible. The crushed fluoride is melted and slowly cooled to undergo crystal growth, whereby a fluoride crystal is obtained. As a crystal growing method, Bridgman method, Czochralski method or the like may be employed.

(Heat-Treating Step)

The fluoride crystal thus obtained is loaded into a heat-treating apparatus and subjected to heat-treatment. When the outside diameter of the fluoride crystal after crystal growth is larger than the inside diameter of the heat-treating crucible, it is preferable that the fluoride crystal is subjected to a simple heat-treatment, an outside working such as grinding or the like, and then the treatment as described below.

Figure 1:
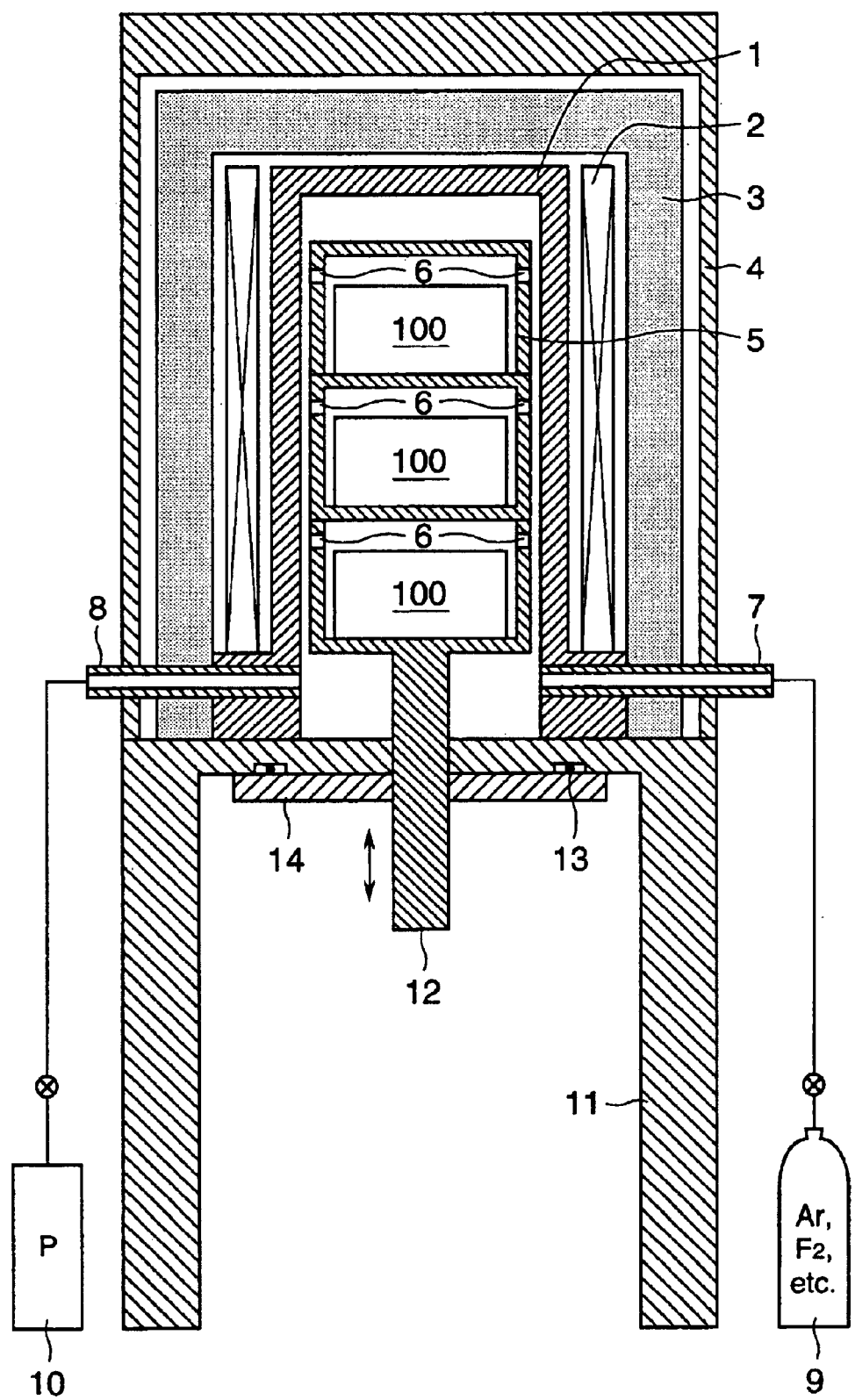
FIG. 1 is a schematic sectional view of a heat-treating apparatus for use in the present invention.

FIG. 1 is a schematic sectional view of a heat-treating apparatus for use in the heat-treating method of the present invention.

This apparatus contains a heat-treating furnace 1 for insulating the inside atmosphere from the outside atmosphere, a heater 2 for heating, a heat insulating material 3, and a cage 4. Reference numeral 5 denotes a crucible for containing and holding a fluoride crystal, and each room is provided with an opening 6 for ventilation.

The heat-treating furnace 1 is provided with a gas-feeding port 7 for introducing an inert gas and/or a fluorine-based gas and a gas exhausting port 8 for exhausting a gas in the heat-treating furnace 1.

The gas-feeding port 7 is connected to a gas source 9 via a valve, and the gas exhausting port 8 is connected to an exhausting pump 10 via a valve. Reference numeral 11 denotes a support stand, reference numeral 12 a support bar for supporting the crucible 5, reference numeral 13 an O ring and reference numeral 14 a bottom lid of the heat-treating furnace 1.

The crucible 5 can move downward, and the downward movement allows the heat-treating furnace 1 to be open so that a fluoride crystal 100 is placed in each room of the crucible. FIG. 1 shows a crucible assembly formed by stacking three crucibles.

By the upward movement of the crucible 5, the bottom lid 14 is closed. Thus the inside of the heat-treating furnace 1, that is, the atmosphere in which fluoride crystals are placed can be sealed. Operation of the exhausting pump 10 allows the gas in the heat-treating furnace to be exhausted though the gas exhausting port 8 and makes it possible to decrease the inside pressure of the heat-treating furnace 1 from the atmospheric pressure to about $1.33 \times 10^{-3}$ Pa.

Application of electric current to the heater 2 allows the inside of the heat-treating furnace 1 to be heated. The inert gas, the fluorine-based gas or the mixture thereof from the gas source 9 is introduced into the heat-treating furnace 1 through the gas-feeding port 7.

A controller for controlling the amount of the electric current applied to the heater 2 is provided so that the inside temperature of the crucible 5 can be kept at a given temperature, although it is not shown in the drawings.

The heat-treating apparatus has been roughly described above. The maximum value of the temperature difference within the crucible can be limited to 5° C. or less by using the above-mentioned heat-treating apparatus in the range of the heating temperature of 900° C. to 1200° C.

Then a heat-treating method according to the preferred embodiment of the present invention will be described.

A fluoride crystal 100 is put into each crucible 5 of the heat-treating apparatus shown in FIG. 1, and if necessary, a solid scavenger is added. The heat-treating furnace 1 is sealed, the inside pressure of the furnace is reduced to about $1.33 \times 10^{-3}$ Pa, and electric current is applied to the heater 2.

If necessary, when the temperature of the crucibles 5 reaches 200° C. to 400° C., the temperature is kept for a certain period of time to remove water adsorbed by the crucibles 5, the internal surface of the heat-treating furnace, the surface of the fluoride crystals and the like.

Thereafter, an inert gas, a fluorine-based gas or the mixture thereof is introduced into the heat-treating furnace, and the inside pressure of the furnace 1 is kept at the atmospheric pressure or in a pressurized state. As an inert gas, rare gases such as argon, helium, neon, krypton and xenon or nitrogen can be used. As a fluorine-based gas, fluorine-containing gases such as $F_2$, $NF_3$, $CF_4$, $CHF_3$, $CH_2F_2$, $C_2F_6$ and $C_3F_8$ can be used. As long as the fluoride can be heated by heat conduction of the atmospheric gas, the pressure inside the heat-treating furnace is not limited and a little reduced pressure close to 1 atm is also applicable. However, the heat treatment is more effective when the pressure is 1 atm or higher. Suitably the gas introduced is an inert gas only, or a fluorine-based gas not containing carbon which has been diluted with an inert gas.

Further, a high-temperature heating is conducted so that the crucibles can be heated to a given temperature or higher, and the heat-treating temperature is maintained for a certain period of time. Thereafter, the amount of electric current applied to the heater is decreased little by little, and the crucibles are naturally cooled. The crucibles are moved downward at a time when their temperature is reduced to room temperature, and the fluoride crystals are taken therefrom. In case of calcium fluoride, suitable heat-treating temperature is 1000° C. or higher and lower than the melting point (1360° C.) of the calcium fluoride crystal. In cases of barium fluoride and strontium fluoride, their heat-treating temperature should be reduced by several tens to several hundreds ° C. compared to the case of calcium fluoride since their melting points are 1280° C. and 1190° C., respectively.

In case of lithium fluoride, its melting point is 842° C. which is much lower than those of the above fluorides, accordingly, the heat-treating temperature should be further reduced.

The fluoride crystals thus obtained after annealing are highly refined ones from which unwillingly introduced oxygen has been removed. Neither turbidity nor coloration is observed and residual stresses are decreased.

(Method of Producing Optical Article)

Then the fluoride crystals thus obtained are subjected to working to be shaped into a disk, a convex lens, a concave lens or a prism. Thus they become optical parts such as lens, mirror and window.

If necessary, a thin film of aluminum oxide, silicon oxide, aluminum fluoride, magnesium fluoride or the like is formed on the surface of the shaped optical part by a film-forming method as sputtering, CVD, evaporation or the like.

Assembling the optical parts thus obtained enables the production of optical apparatus such as laser oscillator, exposure equipment or the like.

Figure 2:
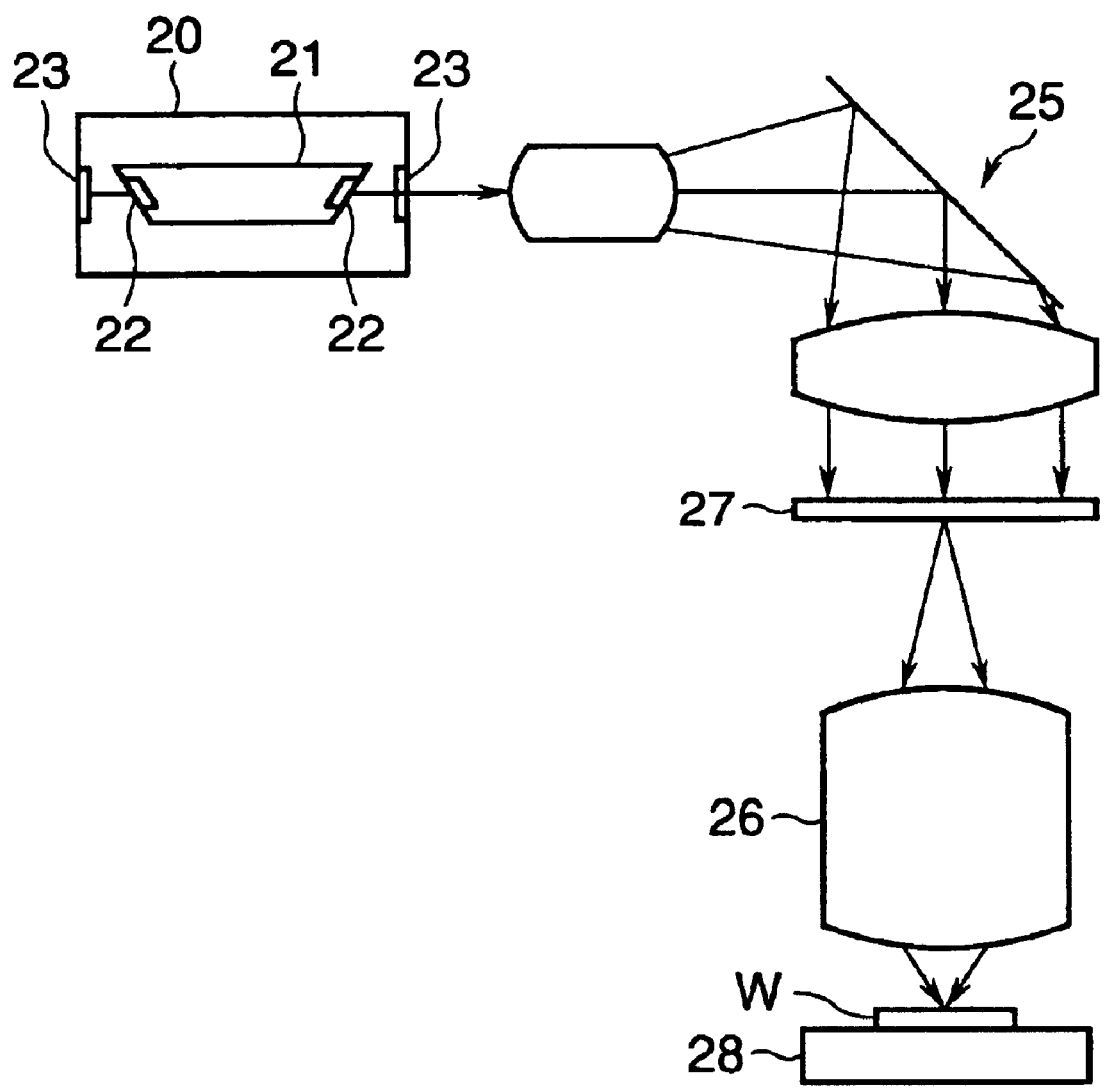
FIG. 2 is a schematic view showing an optical apparatus utilizing the optical parts of the present invention.

FIG. 2 shows an exposure equipment with a laser oscillator for use in photolithography, as one example of the optical apparatus.

The laser oscillator 20 emitting a vacuum ultraviolet light such as ArF or $F_2$ excimer laser light has a laser gas chamber 21, a pair of windows 22 consisting of calcium fluoride, and resonators 23.

The exposure equipment has an illumination optical system 25 and an imaging optical system 26 each of which consists of a group of multiple lens.

The light passed through an optical mask (reticle) 27 forms a light figure on a substance (work) W to be exposed, which is placed on a stage 28 as a holding means, through the imaging optical system 26. Typical examples of the work W include substrates such as Si wafer and glass substrate having a photoresist.

In case of a step-and-repeat method, every time one partition area has been exposed, the stage is moved so that another partition area can be exposed, and this operation is repeated. In case of a scanning method, the whole substance to be exposed is exposed while moving the reticle and the stage relative to each other.

The photoresist on which a latent image has been formed by this exposure is then developed to provide a mask pattern for etching and ion implantation.

Thereafter, by using this mask pattern, ion is implanted into the substrate and the substrate surface is etched.

Thus fine working of the substrate is made possible.

As the fluoride crystal used in the above-described application, a fluoride crystal having high durability and a large diameter is required. In the fluoride crystals immediately after having undergone crystal growth by the Bridgman method or the like, relatively large residual stresses lie on their periphery.

The residual stress is tangible in the form of occurrence of double refraction and will cause deterioration in properties of optical parts. Especially in the optical parts with a large diameter, the amount of double refraction needs to be small on the periphery of the crystal (for example, 10 nm/cm or less in terms of optical path difference), and further it needs to be as small as 5 nm/cm in the center of the crystal.

In the embodiment of the present invention described below, the residual stress can be kept extremely small by applying a force compensating the internal stress distribution after crystal growth to the fluoride crystals and heating the fluoride crystals without melting. Specifically, the fluoride crystals are arranged in an upside-down state with respect to the arrangement in case of the crystal growth and heated in the above heat-treating furnace.

As a way of applying an external force in such a direction that compensates the internal stress distribution, it is simple and preferable that the fluoride crystal made upside-down is arranged and heated in the above heat-treating furnace in state where it is deflected.

Figure 3:
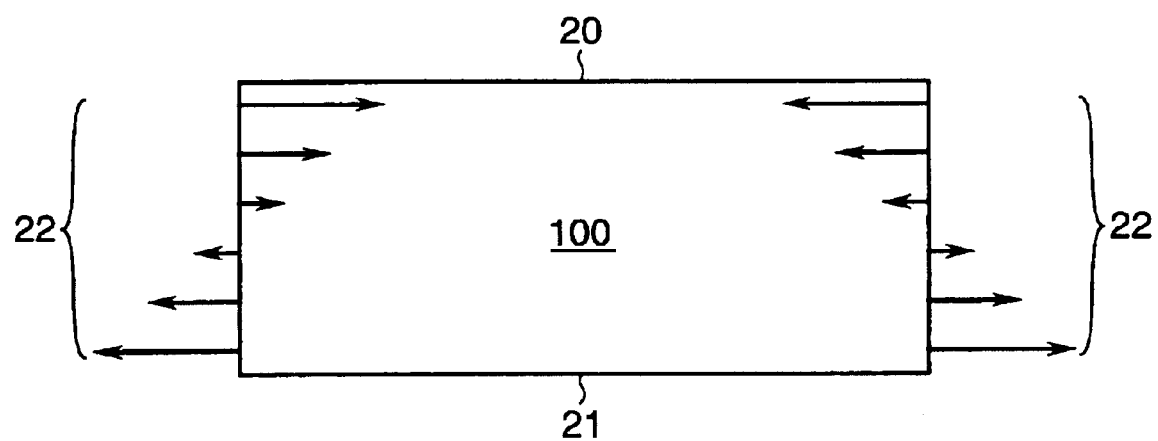
FIG. 3 is a schematic view illustrating a residual stress distribution in a fluoride crystal after crystal growth.

FIG. 3 shows vectors 22 of internal stresses generated in a fluoride crystal W before heat treatment after crystal growth. On the side of the upper surface 20 in the vertical direction, inward internal stresses (compressive stresses) are generated. The magnitude of the internal stresses becomes smaller as they are generated perpendicularly more downward, and the magnitude is substantially zero in the vicinity of the center of the crystal. Perpendicularly further downward, outward internal stresses (tensile stresses) are generated, and the magnitude becomes maximum in the vicinity of the lower surface 21 in the vertical direction.

Figure 4:
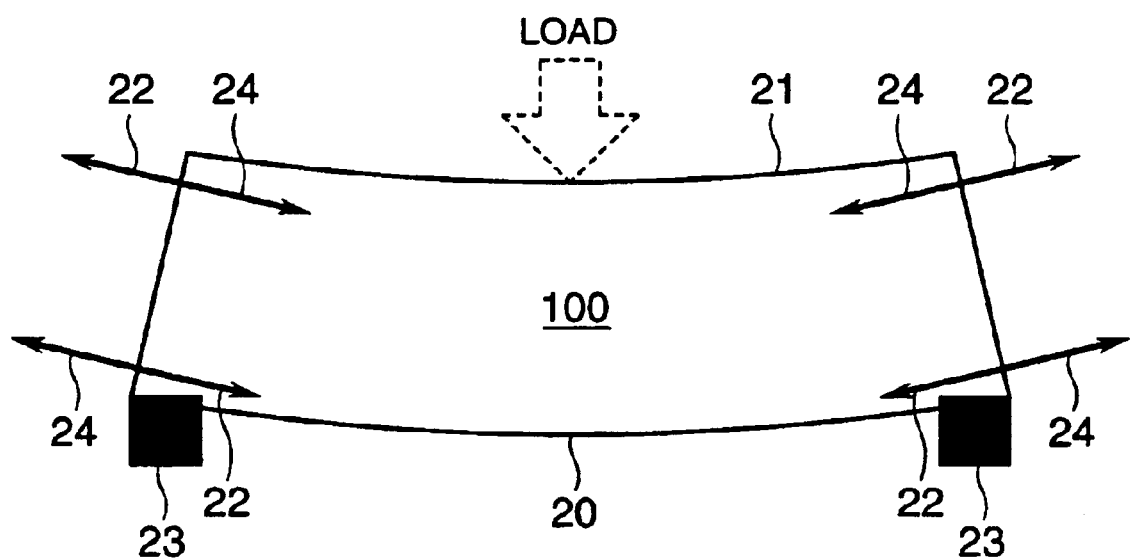
FIG. 4 is a schematic view illustrating a residual stress distribution in a fluoride crystal having after heat-treatment according to one embodiment of the present invention.

Therefore, heat treatment is conducted in such a manner that the fluoride crystal W is made upside-down and arranged in the crucible, as shown in FIG. 4. At this time, ring-shaped supporting members 23 are arranged on the bottom surface of the crucible so that the fluoride crystal W can be deflected by its own weight. In this case, at a time when the crystal is growing, the upper surface 20 is facing downward in the vertical direction while the lower surface 21 upward in the vertical direction. Further, it is preferable that an external load is applied in the vicinity of the center of the surface 21, if necessary.

When heat treatment is conducted in the above state, the internal stresses expressed in vector 24 are generated during the heat treatment and cancel the internal stresses expressed in vector 22 which are generated during the crystal growth and thereafter remain. Thus, the internal stresses after anneal can not be completely zero, but they can be significantly decreased to become smaller.

EXAMPLE 1

Ring-shaped carbon supporting members each having a size of 260 mm in outside diameter, 220 mm in inside diameter and 3 mm in thickness were arranged on the bottom surface of a crucible. A cylindrical calcium fluoride crystal having 250 mm in diameter and about 10 Kg in weight which was grown by the Bridgman method was arranged on the ring-shaped supporting members in the crucible so that the crystal was arranged in a upside-down state with respect to the arrangement in case of the crystal growth and that its lower surface was made apart from the bottom of the crucible, as shown in FIG. 4.

The pressure inside the furnace was once decreased to about $1.33 \times 10^{-3}$ Pa, and argon as an inert gas was introduced, then the pressure inside the furnace was increased to 1 atm. The temperature of the furnace was increased to 1300° C. spending 50 hours. Then the temperature was decreased to 1000° C., and the calcium fluoride crystal was kept at 1000° C. for 30 hours. After that, the calcium fluoride crystal was cooled to room temperature spending 400 hours.

Neither turbidity nor coloration was generated in the calcium fluoride crystal having been thus annealed.

Further, the amount of double refraction was measured by the method of Senarmont under polarization for the calcium fluoride crystals having been annealed. The magnitude of the residual stresses generated in the crystal can be evaluated with this amount. The results showed that an optical path difference was 5 nm/cm or less in the center of the crystal and 10 nm/cm or less on the periphery of the crystal.

EXAMPLE 2

A cylindrical calcium fluoride crystal having 250 mm in diameter and about 10 kg in weight which was grown by the Bridgman method was arranged on the bottom surface of the crucible so that the crystal was placed in an upside-down state with respect to the arrangement in case of the crystal growth.

The pressure inside the furnace was once decreased to about $1.33 \times 10^{-3}$ Pa, then argon as an inert gas was introduced into the furnace to increase the pressure to 1 atm. The temperature was increased to 1300° C. spending 50 hours.

Then the temperature was decreased to 1000° C., and the calcium fluoride crystal was kept at 1000° C. for 30 hours. After that, the calcium fluoride crystal was cooled to room temperature spending 400 hours.

Neither turbidity nor coloration was generated in the calcium fluoride crystal having been thus annealed.

After the amount of double refraction was measured under polarization, it was found that the optical path difference in the center of the crystal was 5 nm/cm or less, but the optical path difference on the periphery of the crystal was inferior to Example 1.

COMPARATIVE EXAMPLE

A cylindrical calcium fluoride crystal having 250 mm in diameter and about 10 kg in weight which was grown by the Bridgman method was arranged on the bottom surface of the crucible in an upside-down state with respect to the arrangement in case of the crystal growth.

The pressure inside the furnace was once decreased to about $1.33 \times 10^{-3}$ Pa, but no special gas was introduced into the furnace and the temperature was increased to 1300° C. Then the temperature was decreased to 1000° C., and the calcium fluoride crystal was kept at 1000° C. for 30 hours. After that, the calcium fluoride crystal was cooled to room temperature spending 400 hours.

Infinite number of particles of turbidity was observed in the calcium fluoride crystal having been thus annealed.

After the amount of double refraction was measured under polarization, it was found that the optical path differences in the center of and on the periphery of the crystal were both inferior to Example 2.

As described in detail above, the present invention provides fluoride crystals in which turbidity and coloration are hard to generate. Further, the present invention provides fluoride crystals having small residual heat stresses and uniform optical characteristics. The fluoride crystals thus obtained are suitable for optical apparatus such as a laser oscillator, an exposure equipment or the like since they can be used in the highly durable and highly transmittable optical parts for vacuum ultraviolet light.

What is aimed is:

1. A method of heat-treating a fluoride crystal comprising, sequentially, the steps of:
   vacuum-exhausting a heat-treating furnace in which a fluoride crystal is placed to a predetermined pressure or less;
   increasing a temperature inside the heat-treating furnace to a first predetermined temperature;
   introducing an inert gas and/or a fluorine-based gas into the heat-treating furnace to achieve and maintain an atmospheric pressure or a pressurized state; and
   increasing the temperature inside the heat-treating furnace to a second predetermined temperature.

2. A method of heat-treating a fluoride crystal according to claim 1, wherein the fluoride crystal is heated while applying a force for compensating an internal stress distribution of the fluoride crystal.

3. A method of heat-treating a fluoride crystal according to claim 2, wherein the fluoride crystal is arranged in the heat-treating furnace so that the fluoride crystal is placed in an upside-down state with respect to arrangement in case of crystal growth, and the fluoride crystal is heated in the state.

4. A method of heat-treating a fluoride crystal according to claim 3, wherein the fluoride crystal is arranged in the heat-treating furnace in a state where the fluoride crystal is deflected.

5. A method of producing an optical part, which comprises working a fluoride crystal treated with a heat-treating method set forth in claim 1 to produce an optical part.

6. An optical apparatus for use in vacuum ultraviolet light, which is produced by utilizing an optical part produced by an optical part-producing method set forth in claim 5.

7. An optical apparatus according to claim 6, wherein the optical part is used for a window material to produce a laser oscillator as the optical apparatus.

8. An optical apparatus according to claim 6, further comprising an optical system having the optical part, a laser oscillator and a holding means for holding a work, wherein the optical apparatus is an exposure equipment.

9. A method of heat-treating a fluoride crystal according to claim 1, wherein a solid scavenger is added to the heat-treating furnace to conduct the heat treatment.

10. A method of heat-treating a fluoride crystal according to claim 1, wherein the heat treatment is conducted after the fluoride crystal is subjected to grinding.

11. A method of heat-treating a fluoride crystal according to claim 1, wherein the first predetermined temperature is from 200° C. to 400° C.

12. A method of heat-treating a fluoride crystal according to claim 1, wherein the second predetermined temperature is from 1,000° C. to 1,360° C.

13. A method of heat-treating a fluoride crystal according to claim 1, wherein after the inside of the heat-treating furnace reaches the first predetermined temperature, this said first predetermined temperature is maintained for a predetermined amount of time in a vacuum-exhausted state.

* * * * *